United States Patent [19]
Sakamoto

[11] Patent Number: 5,750,443
[45] Date of Patent: May 12, 1998

[54] METHOD OF MANUFACTURING SEMICONDUCTOR DEVICE

[75] Inventor: Kazuhisa Sakamoto, Kyoto, Japan

[73] Assignee: Rohm Co., Ltd., Kyoto, Japan

[21] Appl. No.: 793,593

[22] PCT Filed: Jul. 9, 1996

[86] PCT No.: PCT/JP96/01906

§ 371 Date: Mar. 3, 1997

§ 102(e) Date: Mar. 3, 1997

[87] PCT Pub. No.: WO97/03458

PCT Pub. Date: Jan. 30, 1997

[30] Foreign Application Priority Data

Jul. 10, 1995 [JP] Japan ................................. 7-173643

[51] Int. Cl.[6] .................................................. H01L 21/324
[52] U.S. Cl. ................... 438/795; 438/530; 148/DIG. 3; 148/DIG. 4; 148/DIG. 80; 148/DIG. 90; 148/DIG. 92
[58] Field of Search ............... 148/DIG. 3, DIG. 4, 148/DIG. 80, DIG. 90, DIG. 92; 438/795, 530, 159, 334, 407, 453

[56] References Cited

U.S. PATENT DOCUMENTS

| | | | |
|---|---|---|---|
| 4,566,913 | 1/1986 | Brodsky et al. | 437/247 |
| 4,794,217 | 12/1988 | Quan et al. | 437/247 |
| 5,279,973 | 1/1994 | Suizu | 437/25 |
| 5,502,010 | 3/1996 | Nadahara et al. | 437/247 |

FOREIGN PATENT DOCUMENTS

| | | | |
|---|---|---|---|
| 00414266 | 6/1993 | Germany | 437/247 |
| 0023176 | 1/1987 | Japan | 437/247 |
| 0145865 | 6/1989 | Japan | 437/247 |
| 405006863 | 1/1993 | Japan | 437/247 |

Primary Examiner—John Niebling
Assistant Examiner—Long Pham
Attorney, Agent, or Firm—Nikaido Marmelstein Murray & Oram LLP

[57] ABSTRACT

Disclosed is a method of manufacturing a semiconductor device wherein a corpuscular beam is radiated to a semiconductor substrate to create crystal defects therein. The semiconductor substrate is subjected to a heat treatment, e.g. for 1 second to 60 minutes, wherein rapid heating-up, e.g. raising temperature to 550° to 850° C. within 10 minutes, is done in a process prior to that of carrying out of the radiation with a corpuscular beam. By doing so, there is provided a semiconductor device which is free from degradation in electrical characteristics such as current amplification factor and has an increased switching speed, even where crystal defects are created through the radiation of corpuscular beam such as an electron beam to shorten the carrier lifetime. Thus, the inventive semiconductor device is satisfied by both requirements of switching speed and electrical characteristic.

8 Claims, 4 Drawing Sheets

METHOD OF MANUFACTURING SEMICONDUCTOR DEVICE

BACKGROUND ART

There is known a technique of reducing lifetime of carriers by diffusing a heavy metal species such as gold or platinum or radiating a corpuscular beam such as an electron beam, an X-ray and a proton beam, in order to provide a pn junction semiconductor device having a high-speed switching responsibility.

Studies have being made for a long time on the method of diffusing a heavy metal such as gold or platinum into a semiconductor layer. However, there is a problem that the correlation ($h_{FE}-t_{stg}$) between current amplification factor and carrier build-up time period is not necessarily desirable for transistors, etc., because of difficulty in controlling and making uniform for diffusion variables. Furthermore, cares have to be taken for prevention against contamination of a treatment apparatus for use in post-treatment, thus imposing much labor on the process management.

Meanwhile, the method of radiating a corpuscular beam is to radiate a high-energy corpuscular beam so that deep levels of defects are created in a semiconductor layer crystal to thereby reduce lifetime of carriers. These crystal defects once created are restored by a comparatively low temperature of heat treatment, diminishing the effect. As a consequence, there is restriction that such heat treatment has to be carried out at a later process stage in the manufacture of a semiconductor device.

In also the method of corpuscular-beam radiation to reduce carrier lifetime for reducing carrier build-up time period (shortening switching time period), there is still a problem that the correlation ($h_{FE}-t_{stg}$) between current amplification factor and carrier build-up time period is not satisfactory. That is, where the carrier lifetime is reduced to speeding up the switching time period $t_{off}$, the dopant concentration of the collector layer is increased, giving rise to degradation in electrical characteristics such as current amplification factor $h_{FE}$.

It is the object of the present invention to solve the abovestated problems and provide a semiconductor device which is improved in the relation of current amplification factor versus switching time period to provide a high speed of switching characteristic as well as excellent electrical characteristic such as current amplification factor.

DISCLOSURE OF THE INVENTION

As a result of ardent consideration for obtaining a semiconductor device which satisfies both the high-switching characteristics and the improvement on electrical characteristics such as current amplification factor, the present inventor has found that a semiconductor device, possessing a high-switching speed characteristic while maintaining electric characteristics such as current amplification factor, is obtained by subjecting a semiconductor substrate to a heat treatment with rapid heating-up prior to radiation of a corpuscular beam such as an electron beam.

A method of manufacturing a semiconductor device of the present invention, wherein a corpuscular beam is radiated to a semiconductor substrate to create crystal defects therein, is characterized in that the semiconductor substrate is subjected to a heat treatment wherein rapid heating-up is done in a process prior to that of carrying out of the radiation with a corpuscular beam.

Here, the heat treatment with rapid heating-up means heating with temperature rising at a rapid rate, e.g., heating-up from a room temperature to approximately 850° C. is done in 10 minutes or shorter, wherein an optical lamp such as an infrared-ray lamp, a discharge lamp, and laser beam, or high-frequency microwave radiation or otherwise a heating furnace with low thermal capacity is used as a heating device. The heating device with an optical lamp or a high-frequency radiation is in particular preferred because of low thermal capacity.

According to the present invention, since a heat treatment with rapid heating-up is performed prior to radiation of a corpuscular beam such as an electron beam, cluster nuclei such as $SiO_4$ ($SiO_n$ (n>2)) is formed based on oxygen intruded into a semiconductor layer by the heat treatment. The reason for performing the rapid heat treatment is as follows. If the substrate is allowed to stand at a temperature in a range of 400° to 500° C. for a relatively long period of time, the oxygen intruded during the diffusion process into the semiconductor layer will turn into donors, altering the dopant concentration of the semiconductor layer. In order to avoid this, the temperature is to be raised at a rapid rate. By the radiation of corpuscular beam such as an electron beam after the heat treatment, the cluster nucleus portions function as a trap center or a recombination center.

If a corpuscular beam is radiated to the cluster nuclei, it causes occurrence of crystal defects without functioning as a dopant. The function as a trap center or a recombination center based on crystal defects caused by the corpuscular beam radiation serves to shorten the lifetime for carriers, without altering dopant amount and degradation of electric characteristics such as current amplification factor. As a result, the switching speed is raised high while maintaining electric characteristics at high levels.

Preferably, the heat treatment is carried out by raising the temperature up to a temperature range of from 550° to 850° C., and more preferably, the heat treatment is carried out such that the rapid heating-up is achieved to a temperature range of from 550° to 850° C. within 10 minutes, the raised temperature is maintained in the temperature range for a time period of 1 second to 60 minutes, and then the temperature is rapidly lowered. This prevents the oxygen present in the semiconductor layer from turning into donors, and cluster nuclei such as $SiO_n$ (n>2) are formed to function as a trap center, thus efficiently creating crystal defects.

Still preferably, a process of forming an electrode requiring anneal treatment is done between the process of the rapid heating-up and the process of the radiation of a corpuscular beam. By doing so, the electrode metal is free from being damaged by the rapid heat treatment, and the crystal defects once formed by the corpuscular beam radiation are not restored by the anneal treatment for the electrode.

Furthermore, a method of manufacturing a semiconductor device, is characterized by comprising the steps of: (a) forming pn junctions for forming an electronic device in a semiconductor substrate; (b) subjecting the semiconductor device to a heat treatment at a temperature within a range of 550° to 850° C., which temperature being raised by rapid heating-up; (c) forming an insulating film over a main surface of the semiconductor substrate, and then forming a contact hole in the insulating film at a region corresponding to a region of the electronic device to thereby form an electrode thereof; and (d) performing a heat treatment for providing an ohmic contact between the electrode and the semiconductor substrate and then performing radiation of a corpuscular beam to the semiconductor substrate.

With this method, a transistor, which has a high-speed switching characteristic and excellent electric characteristics such as current amplification factor, is readily available by carrying out such that the formation of the pn junctions for forming an electronic device is formation of a base region and an emitter region with the semiconductor substrate rendered as a collector region.

PREFERRED EMBODIMENT OF THE INVENTION

Then, a method for manufacturing a semiconductor device of the present invention will be explained with reference to the drawings. FIGS. 1 to 5 are a view showing a manufacturing process for a transistor as one embodiment of the manufacturing method for a semiconductor device of the present invention.

Figure 1:
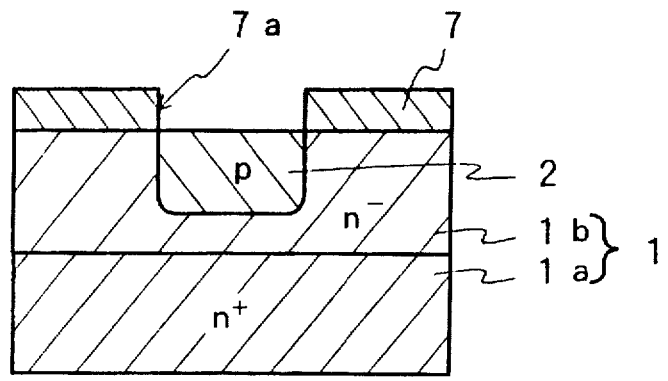
FIG. 1 to FIG. 5 are views showing the manufacturing process of one embodiment according to a semiconductor manufacturing method of the present invention.

First, as shown in FIG. 1, an n type impurity such as phosphorus for example is diffused to a backside surface of an n⁻ type semiconductor layer 1b to form an n⁺ type semiconductor layer 1a. Note that the semiconductor layers 1a and 1b together are referred to as a semiconductor substrate 1. This semiconductor substrate 1 serves as a collector region. Then the main surface of the semiconductor substrate 1 is covered by a mask 7 for example of $SiO_2$ or SiN through the thermal oxidation method or the CVD method. In the mask 7, a first opening 7a is formed by etching in an area where a base region is to be formed. Through the first opening 7a, an p⁻type impurity of boron, gallium, aluminum or the like is doped into the semiconductor substrate 1, thereby forming a p⁻type base region 2.

Figure 2:
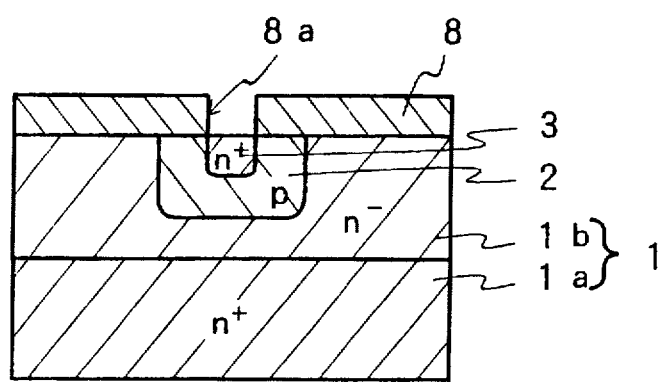

Then, as shown in FIG. 2, a second mask 8 of $SiO_2$ or SiN is newly formed over the surface of the semiconductor substrate to form a second opening 8a in an region where an emitter region is to be formed. Through the second opening 8a, an n impurity of phosphorus, arsenic, antimony or the like is doped into the semiconductor substrate 1, thereby forming an n⁺ type emitter region 3.

Figure 3:
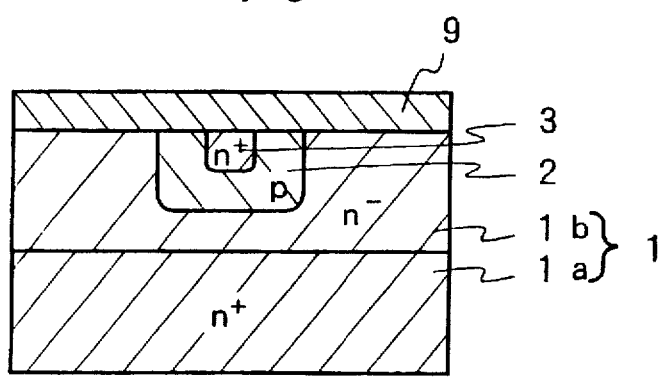

Then, as shown in FIG. 3, the semiconductor substrate 1 is placed in a rapid heat treatment apparatus where the semiconductor substrate 1 is heated up to a temperature in a range of 550° to 850° C. within approximately 10 minutes or earlier, preferably 5 minutes or earlier by an apparatus of Rapid Thermal Anneal (RTA). If the temperature is raised to such a temperature, the temperature is maintained to subject the semiconductor substrate 1 to a heat treatment for one or several seconds to 60 minutes. Thereafter, the semiconductor substrate 1 preferably is rapidly cooled down to a room temperature within almost the same time period as the rapid heating up. In the heat treatment, there occurs oxidation in the entire surface of the semiconductor substrate 1 involving the emitter region 3, thereby providing an insulating layer 9.

In an rapid heat treatment apparatus, it is preferable to use an optical lamp such as an infrared-ray lamp, a discharge lamp, and laser beam, or high-frequency microwave radiation. Where such a devices are used for heat treatment, it is possible to rapidly increase the temperature of the semiconductor substrate 1 without necessity of raising the temperature of the apparatus itself, so that the heating up and cooling down of the semiconductor substrate 1 is rapidly performed. In the rapid thermal anneal, the temperature of the semiconductor substrate 1 may be raised up to the above range, i.e. 550° to 850° C., within approximately 10 minutes, preferably 5 minutes. With this respect, a usual heating oven type, if low in thermal capacity, is usable. If an apparatus as stated above is used, it is also possible to cool the semiconductor substrate 1 down to a room temperature.

The reason for performing the rapid heat treatment will be explained hereinbelow. That is, if temperature is kept at a temperature in a range of 400° to 500° C. for a relatively long period of time, the oxygen intruded during the diffusion process into the semiconductor layer 1b, etc. will turn into donors, altering the dopant concentration of the semiconductor layer. On the other hand, if the temperature exceeds 400° to 500° C. to reach a range of 550° to 850° C., a cluster of nuclei such as $SiO_n$ (n>2) begins to form due to the presence of the oxygen in the semiconductor layer. If cluster nuclei are once formed, the oxygen in the semiconductor layer become free from donating. Such cluster nuclei are turned into trap centers or recombination centers for carriers, if they are subjected to radiation of a corpuscular beam such as an electron beam, hereinafter referred to. For this reason, there is necessity of performing heat treatment on the semiconductor substrate 1 at the range of 550° to 850° C. to form cluster nuclei such as $SiO_n$ (n>2), without allowing the semiconductor substrate 1 to stand at temperatures of 400° to 500° C. for a long period of time. Therefore, the semiconductor substrate 1 is rapidly heated up in order not to stand at temperatures of 400° to 500° C.

Conventionally, there have been cases where heat treatment is performed prior to the process of diffusing heavy metals in order to stabilize the carrier lifetime. However, the effect stated hereinbefore is not obtained by a usual heat treatment. That is, where heat treatment is to be performed at temperatures of 550° to 1000° C., it takes a long period of time, e.g. approximately 40 to 80 minutes for raising the temperature for example to 800° C. In such cases, the time period for which the substrate stands at temperatures of 400° to 500° C. is as long as for example 10 to 20 minutes.

Figure 6:
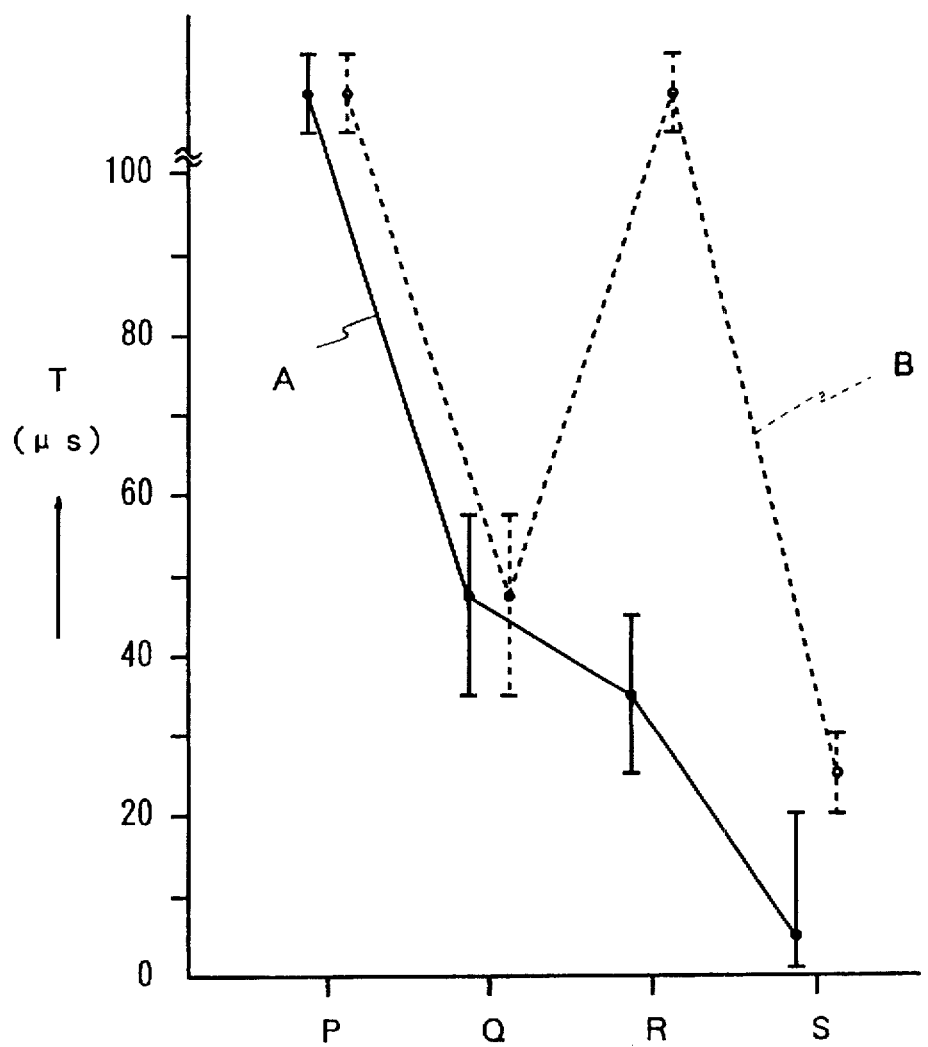
FIG. 6 is a diagram showing the change of lifetime (A) in each process where the temperature is raised to 550° to 850° C. by rapid heating up according to the present invention by contrasting the change of lifetime (B) in temperature raising to 550° to 850° C. by the conventional ordinary heat treatment.

In FIG. 6, there is shown the comparison of difference in carrier lifetime after each process between the above conventional case as stated immediately above that is denoted by the broken line (B) and the case according to the present invention given by the solid line(A) wherein it is about 2 to 10 minutes to raise the temperature to about 800° C. (standing time period at temperatures in a range of 400° to 500° C. is approximately 1 to 2 minutes). In FIG. 6, the axis of abscissa denotes process steps performed on the substrate. That is, P represents a state before treatment, Q heat treatment process with impurity diffusion for formation of a base region, an emitter region, etc., R heat treatment process without impurity diffusion, and S corpuscular beam radiation process. On the other hand, the axis of ordinate represents carrier lifetime T (μs). As clear from FIG. 6, if the substrate is subjected to heat treatment by the conventional method at temperatures in the range of 550° to 850° C., the carrier lifetime becomes long. It is presumed that this is due to the occurrence of donating. On the other hand, according to the rapid heat treatment of the present invention, the carrier lifetime does not become large. It is presumed that this is because there have developed cluster nuclei prior to beginning of donating.

That is, the oxygen in the semiconductor layer is stabilized as cluster nuclei $SiO_n$ (n>2) by the abovestated rapid thermal treatment so that there encounters no disadvantage such as donating of oxygen even where the substrate is heated up approximately for example to 450° C. during the subsequent processes involving the formation of electrodes. However, in order to enhance the effect of the rapid heating up, it is preferred that the substrate after corpuscular radiation be rapidly cooled to lessen the standing time at temperatures of about 400° to 500° C.

After raising the temperature to the range of 550° to 850° C., the time period for which such temperature is maintained is generally 2 to 3 minutes to 15 minutes wherein clusters are formed, though such time period differs depending on the pn junction depth or the impurity concentration in the semiconductor layer. If the oxygen be highly temperature dependent, cluster nuclei $SiO_n$ (n>2) are created within several seconds, thus achieving the purpose. If the treatment time period is too long, there is almost no problem. However, if longer than e.g., 60 minutes, it is not preferred because a number of donors are newly developed to thereby cause change in dopant concentration in the semiconductor layer.

The temperature to which the substrate is rapidly heated up is in the range of 550° to 850° C., preferably in a range of 550° to 700° C. This is because if the temperature is lower than 550° C. cluster nuclei, such as $SiO_n$, are not created efficiently. On the other hand, if the temperature is higher in excess of 850° C., there is no donating of oxygen but the pn junction is shifted in position, thereby resulting in change in electrical characteristics.

Figure 4:
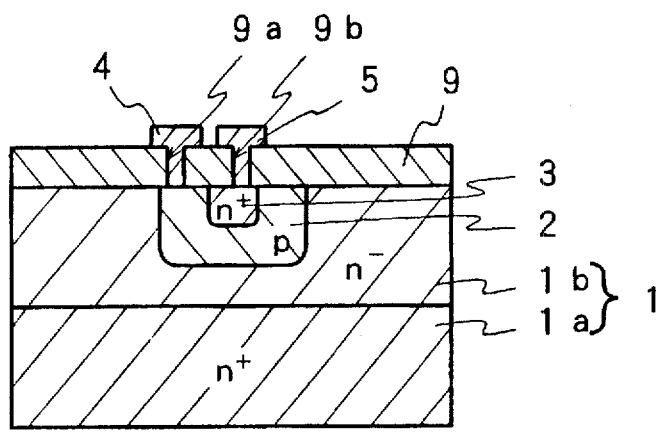

Then, surface electrodes such as a base electrode 4 and an emitter electrode 5 are formed by depositing a conductive metal such as aluminum, as shown in FIG. 4. That is, contact holes 9a, 9b are formed in the insulating film 9 on the surface of the semiconductor substrate 1, and an aluminum film for example is deposited over the surface of the semiconductor substrate 1. The aluminum film is then patterned to provide a base electrode 4 and an emitter electrode 5. In the formation of these electrodes, heat treatment is required to provide ohmic contacts so that the semiconductor substrate 1 is exposed at a temperature of approximately 450° C. for 10 to 60 minutes. However, the oxygen intruded into the semiconductor layer are already in a cluster nuclei form so that the rate of oxygen donating is suppressed and there is no fear of influencing adverse effects on electrical characteristics.

Figure 5:
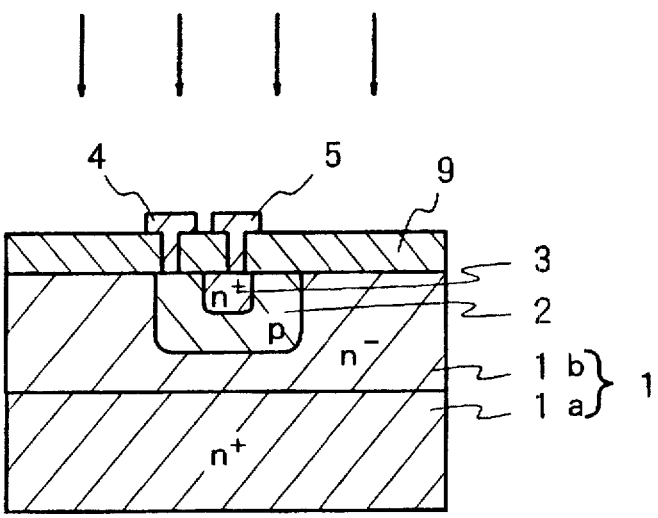

The semiconductor substrate 1 is then radiated on its surface by a corpuscular electron beam at a dose of $1\times10^{13}$ to $6\times10^{15}/cm^2$ with an energy of 500 keV to 10 MeV, as shown in FIG. 5. As a corpuscular beam, an X-ray or a proton beam may be alternatively applied instead of the electron beam. In the present invention, the semiconductor substrate 1 is subjected to rapid thermal treatment to create cluster nuclei prior to the radiation of a corpuscular beam so that crystal defects, if created by the corpuscular beam radiation, are situated around the cluster nuclei. Incidentally, the radiation of corpuscular beam is performed from the main surface side of the semiconductor substrate 1, but it may alternatively be done from the underside thereof.

Then, the crystal defects present principally in a surface layer of the semiconductor substrate 1 are restored by thermal anneal at a temperature of 200° to 450° C. for 10 minutes to 2 hours. Thereafter, a conductive metal such as gold or titanium is sputtered or vacuum-deposited over the backside of the semiconductor substrate to provide a collector electrode (not shown). Thereafter, the semiconductor substrate 1 is divided by scribing into chips to provide individual transistors. The collector electrode is provided over the entire back surface of the highly-doped semiconductor layer so that an ohmic contact is provided there without performing alloying at high temperatures. Therefore, there is almost no possibility of incurring change in the crystal defects created by the corpuscular beam radiation.

In the above embodiment, the rapid thermal treatment is done prior to the formation of the surface electrodes and further the corpuscular beam radiation is after the surface electrode formation. This is to prevent against deformation in the surface electrodes as well as restoration of the crystal defects once created by the radiation of an electron beam, etc. due to highly raising of temperature in the later processes. Unless such problems arises, the thermal treatment of rapid heating may be performed prior to the process of corpuscular-beam radiation.

Figure 7:
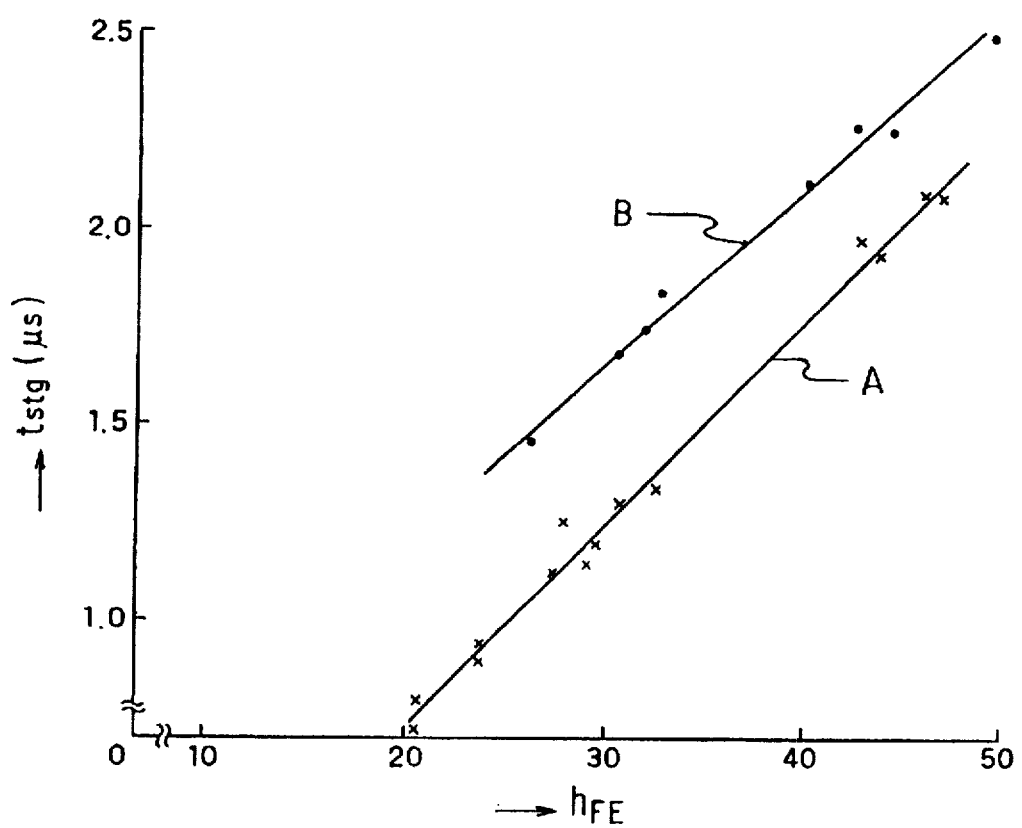
FIG. 7 is a diagram showing the relation between storage time $t_{stg}$ against current amplification factor $h_{FE}$ for a transistor manufactured by the one example of the method of the present invention.

FIG. 7 shows the relation A between the current amplification factor $h_{FE}$ of the transistor manufactured in the above embodiment and the carrier build-up period of time $t_{stg}$ (switching period of time $t_{off}$) thereagainst, together with the relation B for the conventional one (wherein electron-beam radiation is carried out without rapid thermal anneal). As clear from FIG. 7, the transistor according to the present invention is improved in current amplification factor $h_{FE}$ by approximately 20% for the same switching speed, as compared to the conventional one.

Although explanation was made on the transistor exemplified in the above embodiment, the present invention is applicable similarly to other high-power semiconductor devices that require high-speed switching characteristics involving diodes, thyristors, insulated-gate bipolar transistors (IGBT), and MOSFETs.

According to the preset invention, there is provided a semiconductor device which is free from degradation in electrical characteristics such as current amplification factor while having an increased switching speed by creation of crystal defects through the radiation of corpuscular beam such as an electron beam to shorten the carrier lifetime. Thus, the inventive semiconductor device is satisfied by both requirements of switching speed and electrical characteristic.

INDUSTRIAL APPLICABILITY

As explained above, the method of manufacturing a semiconductor device is useful for manufacturing semiconductor devices, such as diodes, transistors, thyristors, insulated-gate bipolar transistors (IGBTs), and MOSFETs, which require high-speed switching characteristics with electric characteristics maintained high.

What is claimed is:

1. A method of manufacturing a semiconductor device wherein a corpuscular beam is radiated to a semiconductor substrate to create crystal defects therein, comprising the steps of:

subjecting said semiconductor substrate to a heat treatment wherein rapid heating-up is done; and rapidly cooling down said semiconductor substrate in a process prior to the step of carrying out the radiation with the corpuscular beam.

2. A method of manufacturing a semiconductor device as claimed in claim 1, wherein said heat treatment is carried out by raising the temperature up to a temperature range of from 550° to 850° C.

3. A method of manufacturing a semiconductor device as claimed in claim 1, wherein said heat treatment is carried out such that said rapid heating-up is achieved to a temperature range of from 550° to 850° C. within 10 minutes, the raised temperature is maintained in said temperature range for a time period of 1 second to 60 minutes, and then the temperature is rapidly lowered.

4. A method of manufacturing a semiconductor device as claimed in claim 1, 2, or 3, wherein said rapid heating-up is performed by heating with using an optical lamp.

5. A method of manufacturing a semiconductor device as claimed in claim 1, 2, or 3, wherein said rapid heating-up is performed by high-frequency induction heating.

6. A method of manufacturing a semiconductor device as claimed in claim 1, wherein a process of forming an electrode requiring anneal treatment is done between the process of said rapid heating-up and the process of the radiation of a corpuscular beam.

7. A method of manufacturing a semiconductor device, characterized by comprising the steps of:

(a) forming pn junctions for forming an electronic device in a semiconductor substrate;

(b) subjecting said semiconductor device to a heat treatment at a temperature within a range of 550° to 850° C., which temperature being raised by rapid heating-up;

(c) forming an insulating film over a main surface of said semiconductor substrate, and then forming a contact hole in said insulating film at a region corresponding to a region of said electronic device to thereby form an electrode thereof; and (d) performing a heat treatment for providing an ohmic contact between said electrode and said semiconductor substrate and then performing radiation of a corpuscular beam to said semiconductor substrate.

8. A method of manufacturing a semiconductor device as claimed in claim 7, wherein the formation of said pn junctions for forming an electronic device is formation of a base region and an emitter region with said semiconductor substrate rendered as a collector region.

* * * * *